United States Patent [19]

McKinzie, III

[11] Patent Number: 4,573,025

[45] Date of Patent: Feb. 25, 1986

[54] DRIFT-EQUALIZED, MULTI-FREQUENCY OSCILLATOR

[75] Inventor: William E. McKinzie, III, Mesa, Ariz.

[73] Assignee: Motorola, Inc., Schaumburg, Ill.

[21] Appl. No.: 595,841

[22] Filed: Apr. 2, 1984

[51] Int. Cl.$^4$ ............................................. H03B 5/18
[52] U.S. Cl. ................................. 331/117 D; 331/96; 331/117 R; 331/177 V
[58] Field of Search .................. 331/96, 116 R, 117 R, 331/117 D, 177 V, 179; 332/30 V; 375/65

[56] References Cited

U.S. PATENT DOCUMENTS

3,538,450 11/1970 Andrea et al. .................. 331/179 X
3,996,530 12/1976 Feistel et al. .................. 331/116 R

Primary Examiner—Eugene R. LaRoche
Assistant Examiner—Robert J. Pascal
Attorney, Agent, or Firm—Lowell W. Gresham

[57] ABSTRACT

An oscillator having the ability to oscillate at a plurality of discrete frequencies in response to an applied digital signal is disclosed. A crystal-controlled, resonant circuit utilizing passive components as frequency determining elements and a PIN diode switching scheme allows the oscillator to demonstrate a tendency for each of the plurality of discrete frequencies to drift equally in response to temperature changes. A two-transistor, emitter coupled amplifying section uses a current mirror for biasing and provides an impedance matching network.

10 Claims, 6 Drawing Figures

DRIFT-EQUALIZED, MULTI-FREQUENCY OSCILLATOR

BACKGROUND OF THE INVENTION

This invention relates generally to oscillators. Specifically, the present invention relates to oscillators having an output signal which oscillates at a frequency selected from a discrete number of possible frequencies. More specifically, the present invention relates to oscillators which maintain a predetermined frequency shift between the possible frequencies as the frequencies drift in response to temperature changes.

The oscillator of the present invention is useful in frequency shift keying (FSK) and other applications needing precise oscillator frequencies and highly reliable oscillator circuits. As is well known in the art, crystal controlled circuits may partially achieve these needs by addressing the precision criteria. However, the reliability criteria suffers when circuits employ unreliable parts or an excessive number of parts. Additionally, circuits which employ too many parts are undesirable because they tend to cost more than circuits which use fewer parts.

One prior art crystal controlled circuit provides a separate crystal for each discrete frequency at which the circuit oscillates. Each crystal is contained within its own sub-oscillator and the sub-oscillators are multiplexed together to generate the output signal. However, such a multiple crystal circuit fails to meet design needs in two ways.

First, the reliability of the oscillator suffers because the oscillator requires excess parts in the form of the multiple sub-oscillator circuits and the multiplexer. Further, the crystal is a relatively unreliable and costly part whose duplication disproportionately hurts the overall circuit reliability and cost.

Second, the multiple crystals technique harms the overall shift accuracy parameter of the oscillator. Shift accuracy characterizes an important parameter in multiple discrete frequency oscillators, like the circuit contemplated in the present invention. These oscillators exhibit shifts or differences in frequency between the discrete frequencies. Switching the frequency of oscillation from one frequency to another produces this frequency shift. Furthermore, in many applications this shift accuracy is more important than the accuracy of the absolute values of the particular frequencies.

As is well known in the art, oscillators which utilize crystals tend to demonstrate some drift in frequency as the temperature of the circuit changes. The frequency drift versus temperature characteristic will not be identical among the various crystals and sub-oscillators in a circuit. This inequality of performance causes the crystals and sub-oscillators to drift relative to each other over a range of temperature. Additionally, since several crystals and corresponding sub-oscillator components cannot be placed in the exact same physical locations in a circuit, the several crystals and sub-oscillator components experience slightly different temperatures. Both these factors combine to cause various sub-oscillators to independently drift in frequency as a function of temperature. Thus, even a circuit adjusted to precisely generate a predetermined shift at one temperature fails to meet design needs when temperature changes cause one frequency to drift too far relative to other frequencies.

The prior art teaches the use of various ovens and temperature compensation schemes to prevent crystal controlled oscillators from drifting as a result of temperature changes. These techniques improve frequency shift accuracy by limiting the drifting over temperature of each of the discrete frequencies. However, these techniques require considerable design effort involving computer analysis and much development testing. Furthermore, these techniques typically use low reliability parts and an excessive number of parts. Therefore, these techniques fail to meet design needs because they yield a poor overall reliability.

An improvement over the multiple crystal circuits utilizes only one crystal and a varactor diode to generate a plurality of output frequencies. Changing a reactance of a circuit coupled to a crystal "pulls" the crystal to a different frequency. Varying the reverse bias voltage across a varactor diode causes the varactor to exhibit a changing capacitance. Thus, the varactor's capacitance change causes the reactance change which tunes the circuit's frequency of oscillation.

The varactor technique improves on the reliability attained from the multiple crystal circuit. Since varactor techniques use the same parts to generate oscillations at different frequencies, the number of parts in the circuit decreases. This reduction in parts tends to increase the reliability. Additionally, such a technique reduces the number of crystals, which are relatively unreliable parts, and thus improves the overall circuit reliability.

The shift accuracy parameter may also slightly improve by using a varactor technique rather than a multiple crystal technique. Specifically, the varactor technique eliminates problems associated with different sub-oscillator circuits having different temperature stability characteristics and different sub-oscillator components experiencing different temperatures within the circuit.

However, varactor techniques still fail to meet design needs. Reliability suffers because varactors require the use of additional parts. Specifically, the frequency accuracy of an oscillation depends on the accuracy of the capacitance exhibited by the varactor. The varactor capacitance accuracy further depends on the accuracy of the reverse bias voltage applied to the varactor. Thus, generating a plurality of precise frequencies requires the application of a corresponding plurality of precise voltages to a varactor. The precise voltage requirement necessitates the addition of accurate voltage regulators and accurate voltage switching devices to the oscillator circuit. Accordingly, the addition of these components harms reliability.

Additionally, varactor techniques tend to decrease the frequency accuracy a particular frequency of oscillation maintains over temperature. Frequency accuracy suffers because semiconductor devices, such as varactors and voltage regulators, determine the frequency. As is well known in the art, semiconductor devices tend to demonstrate a relatively poor temperature stability when compared with the stability of certain passive devices, such as various types of capacitors. For example, a typical temperature coefficient of capacitance for a varactor is significantly worse than that of certain types of capacitors. Thus, the capacitance of a varactor experiences a greater drift resulting from a given temperature change than the capacitance drift experienced by such capacitors. Accordingly, a frequency from an oscillator using a varactor drifts more with temperature and exhibits a worse frequency accuracy than a frequency of an oscillator using such a capacitor.

Varactor techniques also tend to harm the related parameter of shift accuracy. If each of the plurality of frequencies generated by the oscillator tended to drift equally in response to temperature changes, then shift accuracy over temperature would not suffer. However, the temperature coefficient of capacitance of a varactor significantly varies as a function of the reverse bias voltage applied to the varactor. Since varactor techniques determine frequency values for each of the plurality of frequencies by applying different reverse bias voltages to the varactor, different temperature coefficients characterize each of the plurality of frequencies. Therefore, some frequencies drift more than others in response to a given temperature change. Varactor techniques cannot maintain over temperature a shift which has been precisely adjusted at any one given temperature.

SUMMARY OF THE INVENTION

The present invention relates to an oscillator circuit having an output signal which oscillates at a frequency selectable from a predetermined number of discrete frequencies. The circuit of the present invention represents a drift-equalized oscillator because it tends to maintain the shifts or differences in frequency between each of the predetermined frequencies in spite of temperature changes. Frequency selection logic forward and reverse biases PIN diodes coupled to various reactive impedance paths. The forward biasing effectively switches a corresponding reactive impedance path into a resonant portion of the oscillator circuit. The reverse biasing effectively removes a corresponding reactive impedance path from the resonant portion of the oscillator circuit. Thus, various combinations of reactive impedance paths are selectively coupled into the resonant portion causing the overall reactive impedance of the resonant portion to change and switch the oscillation from one frequency to another. Isolation devices electrically remove the frequency selection logic from the resonant portion and an amplifier energizes and amplifies the oscillation.

One of the objects of the present invention concerns maintaining the frequency stability for each of the frequencies of oscillation. The oscillator repeatably reproduces each frequency within a predetermined tolerance over extended periods of time and over a predetermined temperature range.

Another object relates to the interface with the frequency selection logic. The present invention selects the frequency of oscillation based on the application of common, noise tolerant, digital signals. Such signals are reliably and cheaply generated by many well known circuits. Thus, the use of such interface signals enhances overall system reliability, cost, and performance.

Still another object relates to maintaining a reasonable frequency accuracy without resort to relatively unreliable and costly temperature regulation or compensation circuits. Thus, the present invention compromises frequency accuracy with the need to obtain a highly reliable circuit.

However, a related object of maintaining a relatively tight shift accuracy by equalizing the drifting of shift between frequencies over temperature compensates for any small sacrifice in frequency accuracy. The high performance demonstrated by the present circuit results partially from the tightly maintained shift accuracy and partially from a reasonably tight frequency accuracy.

Yet another object concerns improving overall system reliability. Thus, the present invention generates oscillations at each of the frequencies so that each frequency's oscillation contains a similar harmonic content. Overall system reliability and cost improves from the elimination of other system circuits which compensate for harmonic content based on the selected frequency or accommodate an aberrant worst case harmonic content.

Another related object concerns generating each of the frequency's oscillations at a similar, reasonably high power level, System reliability and cost further improves through the elimination of circuits needed to compensate for or accommodate low and aberrant power levels.

Two other objects provide that the oscillator circuit uses a minimal number of components, and that the oscillator circuit uses only relatively simple, standardized components. These two objects provide for an increased reliability and reduced cost.

Other important features of this invention will become apparent from a study of the following specification, claims and the attached drawings.

DETAILED DESCRIPTION OF THE INVENTION

Figure 1:
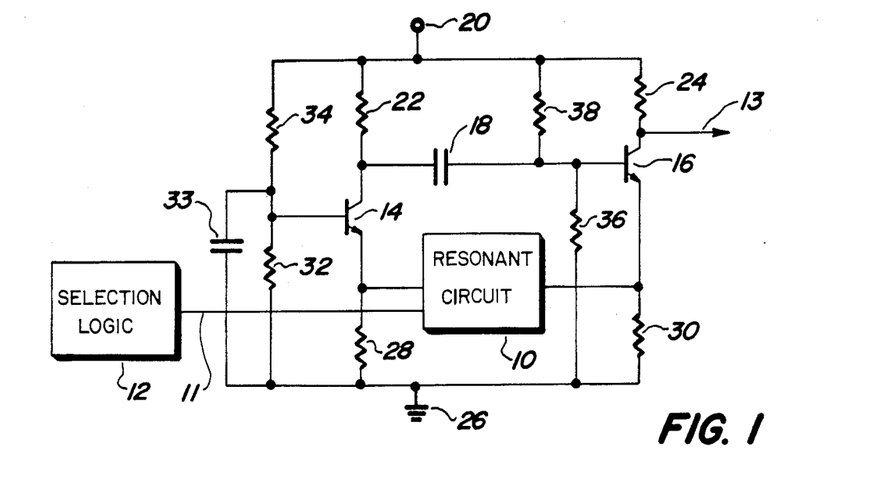
FIG. 1 illustrates a simplified oscillator of one embodiment of the present invention.

FIG. 1 highlights a section of a simplified embodiment of the present invention which amplifies and energizes an oscillation. Selection logic 12 and a resonant circuit 10 represent two other sections of the simplified embodiment, as shown in block form in FIG. 1.

The amplifying section of this embodiment substantially conforms to the amplifying section of a type of circuit known in the art as a Butler oscillator. It contains NPN transistor 14 whose collector couples to the base of NPN transistor 16 through bypass capacitor 18. The collectors of transistors 14 and 16 additionally couple through resistors 22 and 24, respectively, to a terminal 20 adapted to have a positive DC voltage applied thereto. The emitters of transistors 14 and 16 couple to ground 26 through transistor biasing resistors 28 and 30 respectively. Resonant circuit 10, shown as a block in FIG. 1, connects between the emitters of transistors 14 and 16 of the amplifying section. The base of transistors 14 connects to a first node of two resistors 32 and 34, and to a first node of capacitor 33. A second node of resistor 32 and a second node of capacitor 33 connect to oscillator ground 26, and a second node of resistor 34 connects to the positive voltage at terminal 20. Likewise, the base of transistor 16 connects to a first node of two resistors 36 and 38 while a second node of resistor 36 connects to ground 26, and a second node of resistor 38 connects to terminal 20. Finally, selection logic 12, shown as a block in FIG. 1, connects to resonant circuit 10 through a selection signal line 11.

Using techniques well known in the art, the selection of resistance values for resistors 32, 34, 22, and 28 biases transistor 14 so that the collector of transistor 14 obtains a quiescent voltage roughly one half of the positive voltage at terminal 20. Likewise, the selection of resistors 36, 38, 24 and 30 biases the collector of transistor 16 to obtain a quiescent voltage roughly one half of the positive voltage at terminal 20. The collector of transistor 16 may advantageously provide oscillator output 13 of the present invention. In such a case resistor 24 represents the total load presented to transistor 16, and therefore its value may not be freely changeable. Thus, resistor 22 performs the function of a loop gain resistor wherein varying the resistance value of resistor 22 adjusts the gain of the circuit loop defined by transistor 14, transistor 16, and resonant circuit 10.

This embodiment oscillates because the loop defined by transistor 14, transistor 16, and resonant circuit 10 provides positive feedback. An inversion of an oscillation signal occurs between the emitter and collector terminals of transistor 14. At a resonant frequency a phase lag of less than 90 degrees in voltage occurs across resonant circuit 10. A complementary phase lag occurs between the base and emitter terminals of transistor 16. Thus, the net result is a positive feedback loop at some resonant frequency.

A natural resonant frequency of resonant circuit 10 exerts a substantial influence over the determination of the frequency of oscillation while capacitance and inductance characteristics associated with each component of the amplifying section exert only a small influence. Additionally, the oscillator of the present invention oscillates at one of a plurality of different discrete frequencies. Thus, the present invention contemplates that resonant circuit 10 exhibit a plurality of different natural resonant frequencies to cause the oscillator to oscillate at the different discrete frequencies.

Since the different frequencies attainable represent discrete frequencies, the oscillator of the present invention switches from one of the discrete frequencies to another. Accordingly, the information presented to resonant circuit 10 from the selection logic 12 in selection signal 11 determines which particular one of the natural resonant frequencies the resonant circuit exhibits at a particular time. The present invention accommodates a digital signal for selection signal 11. Such a digital signal contains one or more bits of information, and at any given time each bit presents one of two logical states. Additionally, such digital signals typically tolerate relatively large amounts of electrical noise when compared with analog signals.

Figure 2:
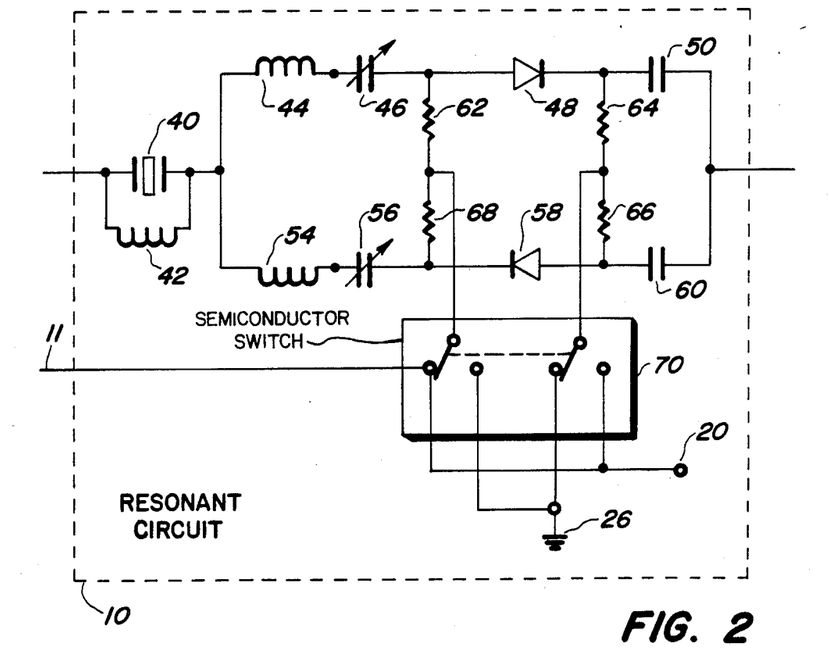
FIG. 2 shows a first embodiment of the resonant circuit block from FIG. 1.

FIG. 2 illustrates a first embodiment of a resonant circuit 10 of the present invention. Generally, it represents a series resonant, crystal-controlled circuit having two electrically discrete reactive impedance paths. Therefore, it exhibits two discrete series resonant frequencies. Resonant circuit 10 also contains structure for selectively enabling and disabling each of these paths in response to selection signal 11. Thus, this embodiment of resonant circuit 10 allows the oscillator of the present invention to function as a typical frequency shift keying (FSK) oscillator because a selection signal causes the oscillator to oscillate at one of two discrete frequencies.

Specifically, crystal 40 connects in parallel with inductor 42. A first node of crystal 40 couples to the amplifier circuit at the emitter of transistor 14, see FIG. 1. A second node of crystal 40 connects in series with inductor 44, which connects in series to variable capacitor 46, which in turn connects to the anode of PIN diode 48. The cathode of PIN diode 48 connects to a first node of bypass capacitor 50, and a second node of bypass capacitor 50 connects to the amplifier circuit at the emitter of transistor 16. Additionally, the second node of crystal 40 connects to inductor 54, which connects in series to variable capacitor 56, which in turn connects to the cathode of PIN diode 58. The anode of PIN diode 58 connects to a first node of bypass capacitor 60, and a second node of bypass capacitor 60 connects to both the amplifier circuit at the emitter of transistor 16 and the second node of bypass capacitor 50.

Those components exerting the greatest influence over the frequency determination at a discrete frequency form a reactive impedance path. Thus, the series connected, crystal 40, inductor 44 and variable capacitor 46 portion of this version of resonant circuit 10 defines a first reactive impedance path, and the series connected crystal 40, inductor 54 and variable capacitor 56 portion defines a second reactive impedance path. Crystal 40 represents an integral portion of both reactive impedance paths because both paths utilize crystal 40.

Each of the series LC combinations, inductor 44 and capacitor 46 or inductor 54 and capacitor 56, provides a series reactance which, when placed in series with crystal 40, pulls the crystal's resonant frequency slightly off its specified resonant frequency.

For crystal 40 this embodiment uses a 70 MHz, series resonant crystal. The values chosen for inductor 44 and variable capacitor 46 allow the first path to exhibit a series resonant frequency offset from the 70 MHz crystal resonance by 1250 Hz. Likewise, the values chosen for inductor 54 and variable capacitor 56 also allow the second reactive impedance path to exhibit a series resonant frequency offset from the 70 MHz crystal resonance by 1250 Hz. However, the first and second reactive impedance path resonances are offset from the 70 MHz in opposite directions and are therefore offset from each other by a frequency of 2500 Hz. Thus, one of the first and second reactive impedance paths causes the oscillator output 13 to oscillate at a high discrete frequency of 70.00125 MHz while the other of the first and second paths causes the output 13 to oscillate at a low discrete frequency of 69.99875 MHz.

Since capacitors 46 and 56 are variable in this embodiment, later adjustments can achieve precise offsets as desired. Bypass capacitors 50 and 60 exhibit relatively large capacitances and therefore exert no significant influence over the natural resonant frequencies of this embodiment of resonant circuit 10. Similarly, inductor 42 merely compensates for internal crystal 40 capacitance which would otherwise tend to decrease the crystal Q, or quality factor, at higher frequencies. Inductor 42 has no other significant influence over the natural resonant frequencies of this embodiment of resonant circuit 10.

PIN diodes 48 and 58 perform a switching function for this resonant circuit 10. PIN diodes exhibit a very low series resistance for RF frequencies, typically less than 1 ohm, when they are biased in a forward mode. The forward biased mode occurs by energizing the anode of the diode at a sufficiently positive DC potential relative to the diode's cathode to cause a substantial amount of current to flow through the diode. The low resistance of a forward biased PIN diode allows it to electrically couple one series connected circuit, such as a reactive impedance path, to another series connected circuit, such as remaining portions of resonant circuit 10. Further, the very low resistance tends to allow a PIN diode to exert only an insubstantial influence over series coupled components. Therefore, in the present invention a forward biased PIN diode exerts almost no influence over determining a frequency of oscillation.

Conversely, PIN diodes exhibit a relatively high series resistance when they are biased in a reverse mode. Additionally, reverse biased PIN diodes tend to exhibit a low capacitance, typically less than 1 pf. The reverse biased mode occurs from energizing the cathode of the diode at a positive DC potential relative to the diode's anode. The high resistance and low capacitance of reverse biased. PIN diodes tends to simulate an open so that the PIN diodes and other series connected components, such as a reactive impedance path, are electrically removed from a circuit. Thus, in the present invention a reverse biased PIN diode and a series connected reactive impedance path exert almost no influence on frequency determination.

The resonant circuit 10 embodiment shown in FIG. 2 resonates at a first frequency that is substantially determined by the characteristics of the first reactive impedance path, which includes the crystal 40, inductor 44, and variable capacitor 46 components. This first resonant frequency occurs when PIN diode 48 is forward biased and PIN diode 58 is reverse biased. Likewise, when PIN diode 58 is forward biased and PIN diode 48 is reverse biased, a second resonant frequency for the resonant circuit occurs. The characteristics of the second resonant path, which includes the crystal 40, inductor 54, and variable capacitor 56 components, substantially determine this second resonant frequency.

A selective energizing section of resonant circuit 10 in conjunction with an isolation section performs the forward and reverse biasing of PIN diodes 48 and 58. The resonant circuit embodiment shown in FIG. 2 utilizes isolation resistors 62, 64, 66, 68 for the isolation section and utilizes semiconductor switch 70 as a selective energizing section. A first node of isolation resistor 62 connects to the anode of PIN diode 48, a first node of isolation resistor 64 connects to the cathode of PIN diode 48, a first node of isolation resistor 66 connects to the anode of PIN diode 58, and a first node of isolation resistor 68 connects to the cathode of PIN diode 58. A second node of isolation resistor 62 connects to both a second node of isolation resistor 68 and a first wiper of semiconductor switch 70. Likewise, a second node of isolation resistor 64 connects to both a second node of isolation resistor 66 and a second wiper of semiconductor switch 70.

Semiconductor switch 70 receives digital input selection signal 11 from selection logic 12, as shown in FIG. 1. Selection signal 11 exerts a first of two logical states to select the first resonant frequency mentioned above, and a second logical state to select the second resonant frequency. In this specific embodiment a high digital logic level represents the first logical state and a low digital logic level represents the second logical state. On-high and on-low contacts associate with each wiper of switch 70 and represent the electrical connection made by wipers of switch 70 in response to high and low logic levels, respectively, from selection signal 11.

The first resonant circuit 10 embodiment shown in FIG. 2 connects a terminal 20, adapted to have a positive voltage applied thereto, to the on-high contact of the first wiper of switch 70 and to the on-low contact of the second wiper of switch 70. Likewise, the on-low contact of the first wiper and the on-high contact of the second wiper connect to ground 26.

Thus, a high logic level on selection signal line 11 causes semiconductor switch 70 to connect the positive voltage on terminal 20 to the first wiper and ground to the second wiper of switch 70. Further, PIN diode 48 becomes energized in the forward biased mode with its forward current limited by isolation resistors 62 and 64. Conversely, PIN diode 58 becomes reverse biased and exhibits no significant conductivity. Thus, selection signal 11 selects the first resonant frequency by electrically coupling the first resonant path into resonant circuit 10 through PIN diode 48 and electrically removes the second resonant path from resonant circuit 10 through the reverse biasing of PIN diode 58. The selected first resonant path then causes the oscillator output 13 to oscillate at the first resonant frequency.

However when a low logic level on selection signal 11 occurs, semiconductor switch 70 connects ground 26 to the first wiper and the positive voltage on terminal 20 to the second wiper causing PIN diode 48 to become reverse biased and causing PIN diode 58 to become forward biased. As a result, the second resonant path electrically couples into resonant circuit 10 through forward biased PIN diode 58 and the first resonant path becomes electrically removed from resonant circuit 10 through reverse biased PIN diode 48. Accordingly, the oscillator output 13 oscillates at the second resonant frequency.

The isolation performed by isolation resistors 62, 64, 66 and 68 in this embodiment prevents the AC oscillation signals in the resonant paths from shorting to the positive voltage on terminal 20, ground 26, or the selective energizing section. Shorting would tend to severely attenuate or kill the oscillation signal. Thus, resistance values for isolation resistors 62, 64, 66, and 68 are reasonably large to provide a maximum amount of isolation. However, the series resistance of a forward biased PIN diode increases as forward current, which is provided but limited by these isolation resistors, through the PIN diode decreases. The forward biased series resistance should be very low to prevent the PIN diode from significantly influencing the oscillation signal. Accordingly, this embodiment balances these two competing considerations by using a value of 1800 ohms for isolation resistors 62, 64, 66, and 68 and 12 volts for the positive voltage on terminal 20.

Additionally, this embodiment separates the DC bias currents for PIN diodes 48 and 58 from other DC currents in the oscillator to guarantee that the PIN diodes remain in their selected forward or reverse biased modes. Bypass capacitors 50 and 60 separate such DC currents at the cathode of PIN diode 48 and at the anode of PIN diode 58, respectively, while permitting AC current to pass. Variable capacitors 46 and 56 perform the separating and AC coupling function at the anode of PIN diode 48 and cathode of PIN diode 58, respectively, in addition to the capacitors' frequency determination function mentioned above. Thus, the PIN diodes' biasing currents remain confined to the PIN diodes and exert no influence on the other portions of the oscillator, and other DC currents in the oscillator exert no influence on the PIN diodes.

The resonant circuit of this embodiment aids the achievement of certain reliability and temperature characteristics of the present invention. Passive devices, such as inductors, capacitors, and a crystal determine the frequencies of oscillation. As is well known in the art, such devices can be chosen which exhibit relatively stable temperature and high reliability characteristics. The semiconductor devices, such as PIN diodes and selective energizing devices, perform only switching functions. Therefore, the less stable temperature characteristics of the semiconductor devices tend not to affect the frequency of oscillation. Furthermore, the use of only one crystal relieves the present invention from experiencing the lower reliability and higher expense which would occur from the use of a plurality of crystals.

This invention utilizes relatively temperature stable parts for crystal 40, inductors 44 and 54, and variable capacitors 46 and 56 to maintain overall frequency accuracy over temperature. The use of relatively temperature stable parts also aids the shift accuracy by limiting overall temperature drift. However, attention to layout and part similarity considerations further aids the shift accuracy and equalizes overall drift characteristics. For example, positioning inductors 44 and 54 and variable capacitors 46 and 56 as close together as possible limits their tendency to experience different temperatures within the resonant circuit. Additionally, using the same type of component for inductors 44 and 54 and for variable capacitors 46 and 56 insures that any temperature drift these components experience will be similar so that shift accuracy remains high and that the oscillator maintains drift equalization.

Additionally, the two reactive impedance paths combined with the PIN diodes are kept similar in impedance at the two resonant frequencies through the use of a PIN diode in series with each of the reactive impedance paths. Thus, even the insubstantial effects caused the PIN diode series resistance, reverse capacitance, and leakage currents tend to affect both reactive impedance paths similarly. As a result, the harmonic content and power level characteristics of each of the discrete frequency oscillations remain similar as well.

Of course those skilled in the art will recognize that various departures from the exact resonant circuit 10 embodiment shown in FIG. 2 do not remove the resonant circuit from the scope of the present invention. For example, the present invention accommodates more than two natural resonant frequencies through the addition of more resonant paths. Some manipulation within the guidelines set forth above may occur relative to the specific connections of circuit devices. Crystal 40 could connect to transistor 16 while bypass capacitors 50 and 60 connect to transistor 14. Other techniques may selectively energize the PIN diodes in response to a digital signal. Other equivalent embodiments may alter the particular connections and logic convention used with the selective energizing section. Furthermore, other devices, such as inductors in higher frequency oscillators, may equally well accomplish the isolation function performed by isolation resistors 62, 64, 66, 68, and capacitors characterized as variable may be fixed in some applications.

Figure 3:
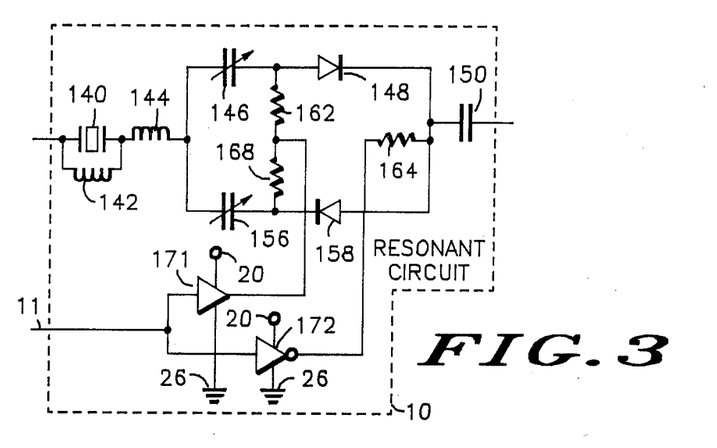
FIG. 3 shows a second embodiment of the resonant circuit block from FIG. 1.

FIG. 3 shows one such departure from the specific connections and the selective energizing section used in the FIG. 2 embodiment. With two basic alterations, this second embodiment of resonant circuit 10 simulates the first embodiment taught by the FIG. 2 resonant circuit 10. Accordingly, FIG. 3 references equivalent components with a number 100 greater than the corresponding FIG. 2 reference number.

One basic alteration of the second embodiment concerns the common use of certain parts which the first embodiment dedicates for use with a particular resonant path. Specifically, crystal 140 and inductor 142 connect in parallel and the second node of crystal 140 additionally connects to a first node of inductor 144. A second node of inductor 144 connects to both a first node of variable capacitor 146 and a first node of variable capacitor 156. A second node of variable capacitor 146 connects to the anode of PIN diode 148 and to a first node of isolation resistor 162. A second node of variable capacitor 156 connects to the cathode of PIN diode 158 and to a first node of isolation resistor 168. The cathode of PIN diode 148 connects to the anode of PIN diode 158, to the first node of bypass capacitor 150, and to a first node of isolation resistor 164. Thus, inductor 144, see FIG. 3, replaces inductors 44 and 54, see FIG. 2; resistor 164, see FIG. 3, replaces resistors 64 and 66 see FIG. 2; and, bypass capacitor 150, see FIG. 3, replaces bypass capacitors 50 and 60, see FIG. 2.

In this second embodiment of resonant circuit 10, crystal 140, inductor 144, and variable capacitor 146 form a first reactive impedance path, and crystal 140, inductor 144, and variable capacitor 156 form a second reactive impedance path. Both crystal 140 and inductor 144 are integral portions of both reactive paths, while variable capacitors 146 and 156 are dedicated for use with the first and second reactive impedance paths, respectively.

This embodiment further enhances the reliability and drift equalization of the FIG. 2 embodiment. The reduction in parts aids the reliability, and the use of a common inductor 144 for frequency determination precludes the possibility of non-identical temperature drift characteristics exhibited by dedicated inductors 44 and 54.

Another basic alteration from the first embodiment taught in FIG. 2 concerns the selective energizing section. In the second embodiment of resonant circuit 10, a second node of isolation resistor 162 connects to a second node of isolation resistor 168 and to the output of digital buffer 171. Additionally, a second node of isolation resistor 164 connects to the output of digital invertor 172. Positive voltage on terminal 20 supplies power relative to ground 26 to invertor 172 and buffer 171. Selection logic 12, see FIG. 1, applies selection signal 11 to both the input of digital buffer 171 and the input of digital invertor 172. Thus, in this specific embodiment buffer 171 and invertor 172 represent the selective energizing section.

A high logic level exerted by selection signal 11 forces the output of digital buffer 171 to a positive voltage close to that of the voltage at terminal 20 and forces the output of digital invertor 172 to a voltage close to ground 26. Buffer 171 supplies sufficient current to forward bias PIN diode 148 through isolation resistors 162 and 164. PIN diode 148 becomes forward biased and selects the first reactive impedance path formed from crystal 140, inductor 144 and variable capacitor 146 to determine the frequency of oscillation of oscillator output 13 while PIN diode 158 becomes reverse biased and electrically removes variable capacitor 156 from resonant circuit 10.

Likewise, a low logic level on selection signal line 11 forces the output of digital buffer 171 close to a ground 16 voltage level and forces the output of digital invertor 172 to a voltage close to the voltage on terminal 20. PIN diode 158 then becomes forward biased from the current supplied by invertor 172 through isolation resistors 164 and 168, and PIN diode 148 becomes reverse biased. Accordingly, oscillator output 13 oscillates at a frequency determined by the second reactive impedance path defined by crystal 140, inductor 144, and variable capacitor 156 while PIN diode 148 electrically removes variable capacitor 146 from resonant circuit 10.

Figure 4:
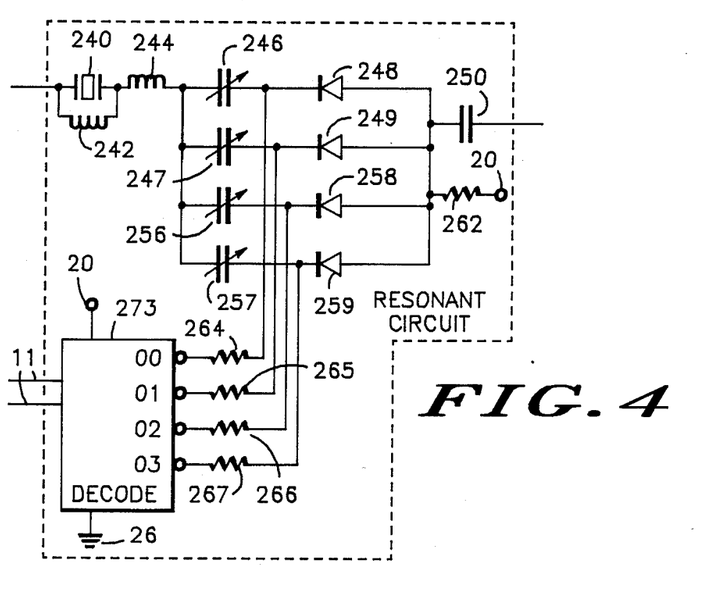
FIG. 4 shows a third embodiment of the resonant circuit block from FIG. 1.

FIG. 4 shows a third embodiment of resonant circuit 10. This third embodiment contains four resonant paths and uses a digital decoder 273 as the selective energizing section. Components equivalent to those used in the first embodiment contain reference numbers 200 greater than the FIG. 2 reference numbers.

For coupling to the amplifying section, the third embodiment contains crystal 240 in parallel with inductor 242, and contains bypass capacitor 250 as described above in connection with the first embodiment. Additionally, the second node of crystal 240 connects to a first node of inductor 244. A second node of inductor 244 connects to a first node of each of variable capacitors 246, 247, 256, and 257. A second node from variable capacitor 246, connects to the cathode of PIN diode 248 and to a first node of isolation resistor 264; a second node from variable capacitor 247 connects to the cathode of PIN diode 249 and to a first node of isolation resistors 265; a second node from variable capacitor 256 connects to the cathode of PIN diode 258 and to a first node of isolation resistor 266; and, a second node from variable capacitor 257 connects to the cathode of PIN diode 259 and to a first node of isolation resistor 267. The anodes of each of PIN diodes 248, 249, 258, and 259 connect together, to a first node of isolation resistor 262, and to the first node of bypass capacitor 250.

Decoder 273 outputs the four signals O0, O1, O2, and O3. Decoder output O0 connects to a second node of isolation resistor 264, decoder output O1 connects to a second node of isolation resistor 265, decoder output O2 connects to a second node of isolation resistor 266, and decoder output O3 connects to a second node of isolation resistor 267. Additionally, a second node of isolation resistor 262 connects to a positive voltage on a terminal 20, and terminal 20 supplies power to decoder 273 relative to ground 26.

Selection logic 12, see FIG. 1, supplies selection signal 11 as two bits of information to two selection inputs of decoder 273. One of the four decoder 273 outputs exhibits a near ground 26 voltage level (low) in response to a corresponding selecting binary code input on selection signal 11. The three remaining non-selected decoder 273 outputs remain at a voltage near the positive voltage on terminal 20 (high). Thus, a predetermined binary code on selection signal 11 causes one of the decoder 273 outputs to exhibit a low.

For example, a binary code from selection signal 11 which forces decoder 273 output O0 low forward biases PIN diode 248 by providing a forward current path from terminal 20 through isolation resistor 262, PIN diode 248, isolation resistor 264 and decoder 273 to ground 26. Other binary codes on selection signal 11 cause PIN diodes 249, 258, or 259 to become forward biased. The three decoder 273 outputs which are not selected exhibit a high level. Since the current which forward biases the selected PIN diode causes a voltage drop across isolation resistor 262, the non-selected PIN diodes remain reverse biased between the non-selected decoder 273 outputs, which exhibit a high, and isolation resistor 262.

This third embodiment of resonant circuit 10 contains a first reactive impedance path wherein frequency is substantially determined by crystal 240, inductor 244, and variable capacitor 246; a second reactive impedance path uses crystal 240, inductor 244, and variable capacitor 247 to determine oscillation frequency; a third reactive impedance path uses crystal 240, inductor 244, and variable capacitor 256 to determine oscillation frequency; and a fourth reactive impedance path uses crystal 240, inductor 244, and variable capacitor 257 to determine oscillation frequency. Thus, in a manner similar to that described above in connection with the first and second resonant circuit 10 embodiments, a binary code on selection signal 11 causes one of four decoder 273 outputs to forward bias one of four PIN diodes which electrically couples a corresponding reactive impedance path into resonant circuit 10 and, selects one of four frequencies of oscillation. At the same time decoder 273 reverse biases the three remaining non-selected PIN diodes to electrically remove the three non-selected reactive impedance paths from resonant circuit 10.

In a manner similar to that described above in conjunction with the first embodiment of resonant circuit 10, the third embodiment again uses passive components, such as crystals, inductors, and capacitors to determine frequency. Semiconductor devices, such as decoders and PIN diodes perform only switching functions and therefore have little effect over frequency determination. Additionally, like the second embodiment of resonant circuit 10, commonality of parts in crystal 240 and inductor 244 tends to reduce the circuit to a minimum number of dedicated frequency determining components and therefore aids drift equalization.

Figure 5:
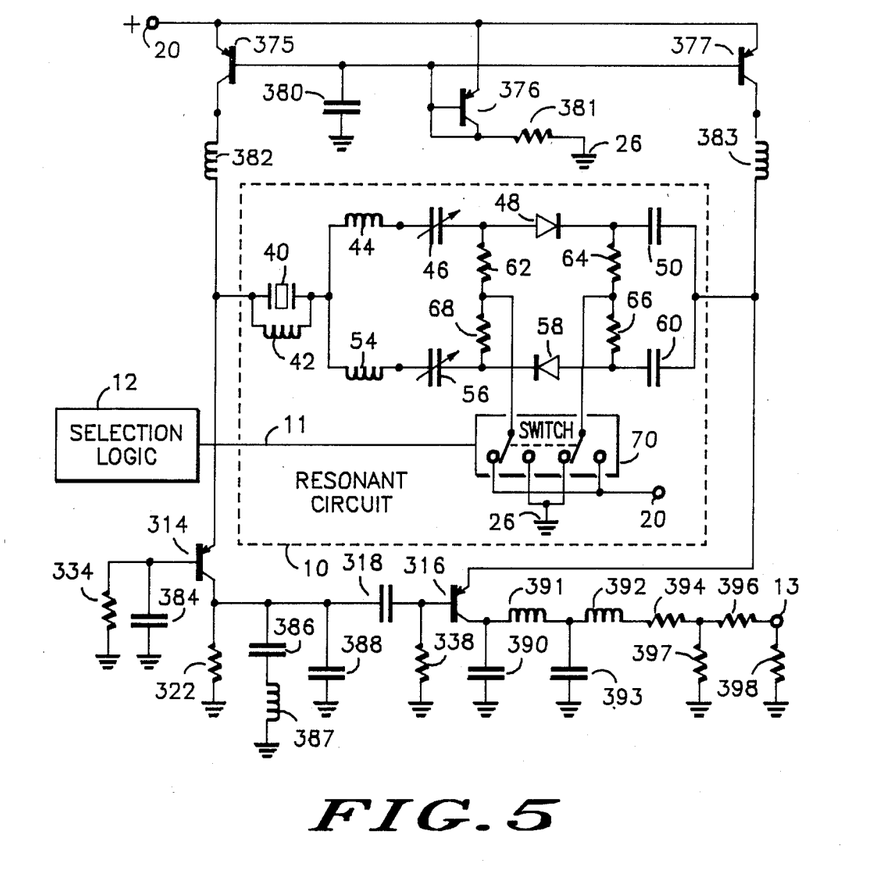
FIG. 5 uses the first embodiment from FIG. 2 for a resonant circuit block in showing an alternate oscillator embodiment.

FIG. 5 shows an embodiment of the present invention which incorporates the first embodiment of resonant circuit 10. This specific embodiment operates in generally the same manner as described above in conjunction with FIGS. 1 and 2. However, various alterations enhance temperature stability, power, and harmonic content characteristics of oscillator output 13.

This embodiment utilizes a current mirror to provide bias currents to transistors 314 and 316, which are PNP transistors in this alternate embodiment. The current mirror includes PNP transistors 375, 376 and 377 each of whose emitters connect to the positive voltage on terminal 20. The bases of each of transistors 375, 376, and 377 connect together, to a first node of resistor 381, to the collector of transistor 376, and to a first node of filter capacitor 380. Second node of resistor 381 and filter capacitor 380 connect to ground 26. The current mirror's output occurs at the collectors of transistors 375 and 377.

The current mirror advantageously replaces transistor biasing resistors 28 and 30 from FIG. 1 by providing a constant current source over temperature at a high AC impedance to transistors 314 and 316. Thus through the current mirror, oscillator output 13 tends to be less responsive to variations in temperature and supply voltage and tends to provide a more stable output frequency and power level.

A first node of decoupling inductor 382 connects to the collector of transistor 375, and a first node of decoupling inductor 383 connects to the collector of transistor 377. A second node of decoupling inductor 382 couples to the first embodiment of resonant circuit 10 described above and to the emitter of PNP transistor 314. Likewise, a second node of decoupling inductor 383 couples to the first embodiment of resonant circuit 10 described above and to the emitter of PNP transistor 316. These decoupling inductors prevent the AC oscillation signal from influencing the operation of the current mirror and decreasing power output.

FIG. 5 shows the first embodiment of resonant circuit 10 coupled between the emitters of transistors 314 and 316. As described above, other embodiments within the scope of the present invention also perform the functions of resonant circuit 10.

Resistor 334 and decoupling capacitor 384, both coupled between the base of transistor 314 and ground 26 in parallel, and loop gain resistor 322, coupled between the collector of transistor 314 and ground 26, aid in biasing transistor 314.

Additionally, a parallel LC circuit couples between the collector of transistor 314 and ground. Bypass capacitor 386 connects in series between the collector of transistor 314 and a first node of inductor 387, while a second node of inductor 387 connects to ground 26. Variable capacitor 388 connects between the collector of transistor 314 and ground 26. Thus, bypass capacitor 386 prevents DC biasing currents at the collector of transistor 314 from shorting to ground 26. And, the capacitor 388 and inductor 387 combination tends to filter out harmonics of the oscillation signal not within the range of frequencies contemplated in the design of resonant circuit 10 and compensates for some of the phase lag that occurs between the base and emitter of transistor 316.

Bypass capacitor 318 AC couples the oscillator signal at the collector of transistor 314 to the base of transistor 316, while resistor 338, connected between the base of transistor 316 and ground 26, sets DC biasing voltage level at the base of transistor 316.

An impedance matching network and load resistance replaces the simple load resistor 30 described in FIG. 1. The impedance matching network includes: capacitor 390, connected between the collector of transistor 316 and ground 26; inductor 391, having a first node connected to the collector of transistor 316; inductor 392, having a first node connected to a second node of inductor 391; capacitor 393, connected between the second node of inductor 391 and ground 26; resistor 394, having a first node connected to a second node of inductor 392; resistor 396, having a first node connected to a second node of resistor 394; and, resistor 397, connected between the second node of resistor 394 and ground 26. Oscillator output 13 is presented at a second node of resistor 396 and energizes a load represented as resistor 398.

The impedance matching network increases the AC impedance presented to the collector of transistor 316 relative to the load impedance, resistor 398, and thus provides a more efficient output power match. Furthermore, the impedance matching network represents one which is bandlimited. Therefore, it is responsible for attenuating higher unwanted harmonics present in the output. Additionally, resistors 394, 396, and 397 implement a 50 ohm, 3 dB pad useful for providing a stable resistive load to the impedance matching network in the event that the load is not entirely resistive.

Figure 6:
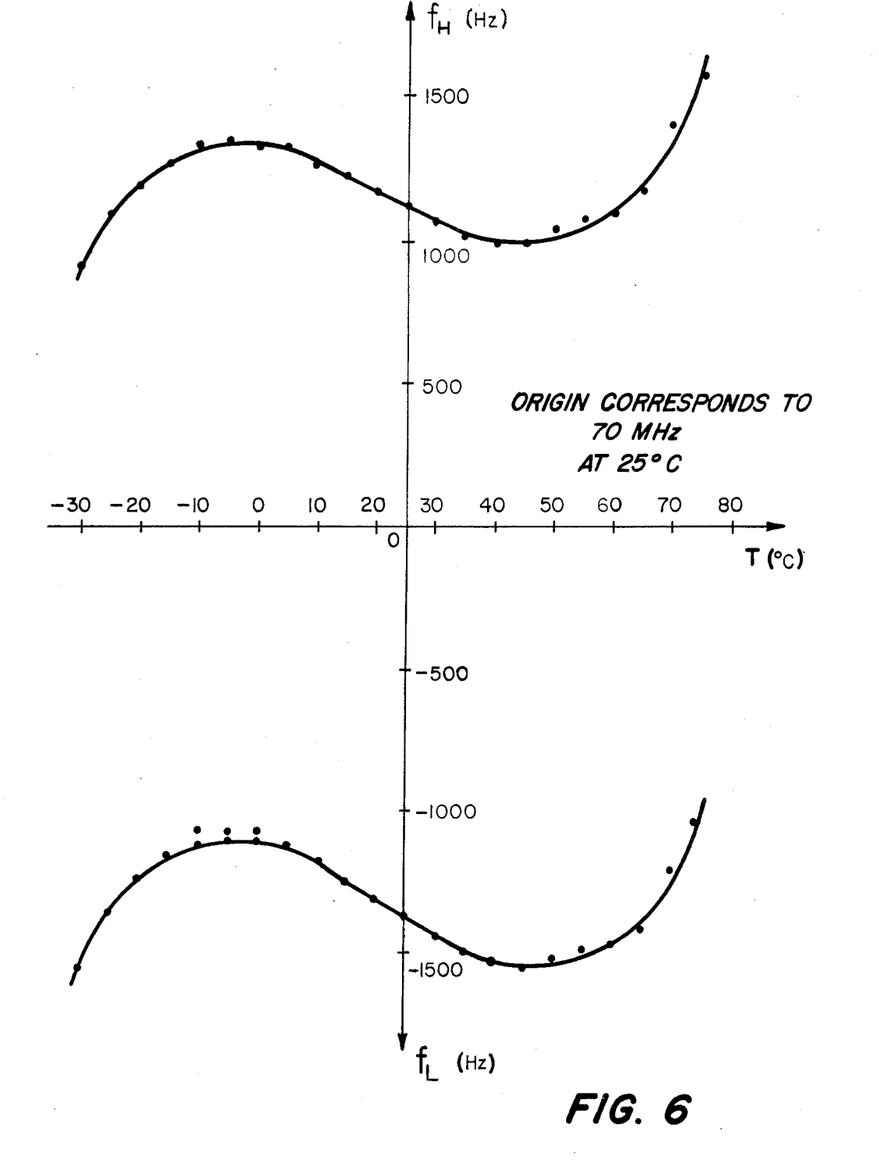
FIG. 6 shows a typical example of the shift equalization performance of the oscillator from FIG. 5.

FIG. 6 illustrates frequency and shift accuracy characteristics of a FIG. 5 alternate embodiment of the present invention which utilizes layout techniques well known in the art and the following parts:

| REFERENCE NUMBER | PART NUMBER or VALUE |
|---|---|
| | Transistors: |
| 375, 376, 377 | MHQ3798, matched PNP small signal |
| 314, 316 | 2N4957 |
| | Crystal: |
| 40 | 70 MHz 52-P07470D003 |
| | PIN diodes: |
| 48, 58 | MPN3401 |
| | Semiconductor switch: |
| 70 | MC14052 |
| | Inductors: |
| 42 | 1.0 uH |
| 44, 54, 392 | .22 uH |
| 382, 383, 387 | .33 uH |
| 391 | .82 uH |
| | Capacitors: |
| 50, 60, 318, 380, 384, 386 | 1000 pf |
| 44, 54 | 7 pf-25 pf, variable |
| 393 | 18 pf |
| 388 | 5.5 pf-18 pf, variable |
| 390 | 5 pf |
| | Resistors: |
| 322 | 390 ohm |
| 334 | 75K ohm |
| 338 | 68K ohm |
| 62, 64, 66, 68 | 1800 ohm |
| 381 | 3900 ohm |
| 394, 396 | 8.2 ohm |
| 397 | 150 ohm |
| 398 | 50 ohm |

The foregoing description uses various embodiments and types and characteristics of components to illustrate the present invention. However, those skilled in the art will recognize that changes and alterations can be made in these embodiments and types and characteristics of the components without departing from the scope of the present invention.

What is claimed is:

1. A frequency switchable oscillator having a frequency of oscillation relative to an oscillator ground, said frequency being selected from a predetermined number of discrete frequencies, said oscillator comprising:
   a. a resonant circuit having
      1. a predetermined number of reactive impedance paths for determining each frequency of oscillation from the predetermined number of discrete frequencies,
      2. a first PIN diode, having forward and reverse biased modes, the first diode coupled to one of the reactive impedance paths so that when the first diode is in the reverse bias mode the first diode electrically removes the one of the reactive impedance paths from said resonant circuit,
      3. a selective energizing section for energizing the first PIN diode in the forward biased mode so that the one of the reactive impedance paths coupled to the first diode is electrically coupled into said resonant circuit through the first diode when the first diode is in the forward biased mode and so that the one of the reactive impedance paths coupled to the first diode substantially influences the frequency of oscillation of the oscillator,
      4. means, coupled to the first PIN diode and coupled to the selective energizing section, for isolating the one of said reactive impedance paths connected to said first PIN diode from the selective energizing section and from oscillator ground, and for providing biasing current to said first PIN diode, and 5. a crystal, having a natural resonant frequency, the crystal coupled to the plurality of reactive impedance paths so that the crystal is an integral portion of each of the reactive impedance paths;

b. means, coupled to said resonant circuit, for amplifying the oscillation; and c. selection logic, coupled to the selective energizing means of said resonant circuit, for providing a selection signal which causes the oscillator to oscillate at one of the predetermined frequencies.

2. An oscillator as claimed in claim 3, wherein:
a. the predetermined number of discrete frequencies consists of a high discrete frequency and a low discrete frequency;
b. the predetermined number of reactive impedance paths of said resonant circuit consists of a first reactive impedance path and a second reactive impedance path; and
c. the natural resonant frequency of the crystal of said resonant circuit is greater than the low discrete frequency and is less than the high discrete frequency.

3. An oscillator as claimed in claim 2 wherein said resonant circuit additionally comprises a second PIN diode and wherein:
a. one of said resonant circuit first and second reactive impedance paths comprises a first capacitor and the other of the reactive impedance paths comprises a second capacitor;
b. said resonant circuit first PIN diode has a cathode and an anode and couples in series with the first capacitor so that the first diode cathode is coupled to said first capacitor;
c. said resonant circuit second PIN diode has a cathode and an anode and couples in series with the second capacitor so that the second diode anode is coupled to the second capacitor; and
d. said resonant circuit isolating means isolates both the first and second capacitors from said resonant circuit selective biasing means and oscillator ground, and provides biasing currents to both the first and second PIN diodes.

4. An oscillator as claimed in claim 3 wherein said resonant circuit isolating means comprises:
a. a first resistor having first and second nodes, the first resistor first node coupled to the cathode of the first PIN diode;
b. a second resistor having first and second nodes, the second resistor first node coupled to the anode of the second PIN diode, and the second resistor second node coupled to the first resistor second node and to said resonant circuit selective energizing means; and
c. a third resistor having first and second nodes, said third resistor first node coupled to one of the anode of the first PIN diode and the cathode of the second PIN diode, the third resistor second electrode coupled to said resonant circuit selective energizing means.

5. An oscillator as claimed in claim 4 wherein said resonant circuit additionally comprises a first bypass capacitor coupled to one of the anode of the first PIN diode and the cathode of the second PIN diode for confining PIN diode biasing currents to the PIN diodes.

6. A frequency switchable oscillator having a frequency of oscillation relative to an oscillator ground, said frequency being selected from a predetermined number of discrete frequencies, said oscillator comprising:

a. resonant circuit having
1. a predetermined number of reactive impedance paths for determining each frequency of oscillation from the predetermined number of discrete frequencies,
2. a first PIN diode, having forward and reverse biased modes, the first diode coupled to one of the reactive impedance paths so that when the first diode is in the reverse biased mode the first diode electrically removes the one of the reactive impedance paths from said resonant circuit,
3. a selective energizing section for energizng the first PIN diode in the forward biased mode so that the one of the reactive impedance paths coupled to the first diode is electrically coupled into said resonant circuit through the first diode when the first diode is in the forward biased mode and so that the one of the reactive impedance paths coupled to the first diode substantially influences the frequency of oscillation of the oscillator, and
4. means, coupled to the first PIN diode and coupled to the selective energizing section, for isolating the one of said reactive impedance paths connected to said first PIN diode from the selective energizing section and from oscillator ground, and for providing biasing current to said first PIN diode;

b. selection logic, coupled to the selective energizing means of said resonant circuit, for providing a selection signal which causes the oscillator to oscillate at one of the predetermined frequencies;

c. a first transistor having an emitter and a collector, said first transistor emitter coupled to said resonant circuit;

d. a second transistor having an emitter, base and collector, said first transistor collector coupled to said sescond transistor base, and said second transistor emitter coupled to said resonant circuit;

e. a loop gain resistor coupled between said first transistor collector and oscillator ground for adjusting the gain of a circuit loop formed from said first transistor, said second transistor, and said resonant circuit; and f. means, coupled to said first and second transistors, for supplying biasing current to said first and second transistors.

7. An oscillator circuit as claimed in claim 6 wherein said transistor biasing means comprises a current mirror.

8. An oscillator circuit as claimed in claim 7 additionally comprising a decoupling inductor coupled between said current mirror and the emitter of said first transistor for reducing the influence of oscillations on said current mirror.

9. An oscillator circuit as claimed in claim 6 additionally comprising an impedance matching network coupled to the collector of said second transistor.

10. A drift-equalized, FSK oscillator having high and low discrete frequencies of oscillation responsive to a digital signal having first and second logical states, the oscillator comprising:

a. a series resonant crystal having a natural resonant frequency higher than the low discrete frequency and lower than the high discrete frequency, and said crystal having first and second nodes;
b. an inductor in series with said crystal so that said inductor is coupled to said crystal second node;
c. a first capacitor coupled to said inductor and crystal so that said first capacitor, inductor, and crystal substantially influence the determination of a first of the high and low discrete frequencies;
d. a second capacitor coupled to said inductor and crystal so that said second capacitor, inductor, and crystal substantially influence the determination of a second of the high and low discrete frequencies;
e. a first PIN diode, having a cathode and an anode, said first PIN diode cathode being coupled to said first capacitor;
f. a second PIN diode, having a cathode and an anode, said second PIN diode anode being coupled to said second capacitor, and said second PIN diode cathode being coupled to said first PIN diode anode;
g. means for biasing said first and second PIN diodes so that said first PIN diode is forward biased while said second PIN diode is reverse biased in response to the external digital signal being in a first logical state, and so that said first PIN diode is reverse biased while said second PIN diode is forward biased in response to the external digital signal being in a second logical state;
h. a first transistor having an emitter and a collector, said first transistor emitter coupled to a first one of the first node of said crystal and said PIN diodes;
i. a second transistor having an emitter, base and collector, said first transistor collector coupled to said second transistor base, and said second transistor emitter coupled to a second one of the first node of said crystal and said PIN diodes;
j. a current mirror coupled to the emitters of said first and second transistors for biasing said first and second transistors;
k. a decoupling inductor coupled between said current mirror and said first transistor; and
l. an impedance matching network coupled to the collector of said second transistor.

* * * * *